United States Patent [19]

Masuda et al.

[11] Patent Number: 5,148,168
[45] Date of Patent: Sep. 15, 1992

[54] DIGITAL-TO-ANALOG CONVERTER USING PULSE-WIDTH MODULATION

[75] Inventors: Toshihiko Masuda; Masaaki Ueki, both of Tokyo, Japan

[73] Assignee: Sony Corporation, Tokyo, Japan

[21] Appl. No.: 693,373

[22] Filed: Apr. 30, 1991

[30] Foreign Application Priority Data

May 16, 1990 [JP] Japan ................. 2-125856

[51] Int. Cl.[5] ............................. H03M 1/82
[52] U.S. Cl. .................... 341/152; 307/265; 332/109
[58] Field of Search ............ 341/53, 144, 152; 375/22; 307/265, 269; 332/109

[56] References Cited

U.S. PATENT DOCUMENTS

| | | | |
|---|---|---|---|
| 3,576,575 | 4/1971 | Hellwarth et al. | 341/152 |
| 3,912,863 | 10/1975 | Patience | 341/53 |
| 4,400,692 | 8/1983 | Klein | 341/152 |
| 4,467,319 | 8/1984 | Uchikoshi | 341/152 |
| 4,542,371 | 9/1985 | Uchikoshi | 341/152 |
| 4,780,656 | 10/1988 | Mitchell | 318/798 |
| 4,929,947 | 5/1990 | Toyama | 341/146 |
| 5,021,788 | 6/1991 | Ueki et al. | 341/152 |
| 5,023,615 | 6/1991 | Yamada et al. | 341/152 |

FOREIGN PATENT DOCUMENTS

| | | | |
|---|---|---|---|
| 60-100830 | 6/1985 | Japan | 341/152 |
| 61-39728 | 2/1986 | Japan | 341/152 |
| 64-58125 | 3/1989 | Japan | |

OTHER PUBLICATIONS

The Engineering Staff of Analog Devices, Inc., Analog-Digital Conversion Handbook, 1986, pp. 186-188.

*Primary Examiner*—Howard L. Williams
*Attorney, Agent, or Firm*—Alvin Sinderbrand; William S. Frommer

[57] ABSTRACT

A digital-to-analog converter utilizing a PWM system for converting input digital data to PWM signals and finally to an analog signal divides the sampling period of the input digital data into an even number of sampling periods and produces PWM signals with equal pulse widths corresponding to the input digital data each divided sampling period, whereby a simple structure is provided to reduce harmonic distortion and obtain a high quality analog signal.

4 Claims, 5 Drawing Sheets

DIGITAL-TO-ANALOG CONVERTER USING PULSE-WIDTH MODULATION

BACKGROUND OF THE INVENTION

1. Field of the Invention

The present invention relates to a digital-to-analog converter utilizing a pulse-width modulation (PWM) system.

2. Description of Related Art

In the past, in digital audio disk (DAD) players or the like, a digital-to-analog (D-A) converter utilizing a so-called PAM system, or a stepped-wave system, in which input digital data is converted to pulse-amplitude modulated (PAM) signals and finally to an analog signal, was widely used.

Recently, a D-A converter utilizing a so-called PWM system in which input digital data is converted to pulse-width modulated (PWM) signals and finally to an analog signal, has come into use.

In this case, in order to reduce quantization noise within the audio frequency domain and obtain necessary resolution, an over sampling method and a noise shaping method, disclosed, for example, in the gazette of Japanese Laid-open Patent Publication No. 61-177819, are used in combination and, thereby, 3-bit 7-value digital data D1 to D7 and PWM signals whose pulse widths are TO to 7TO corresponding to the values [1] to [7] of the digital data, as shown in FIG. 1, are generated.

The D-A converter utilizing the PAM system, from the principle upon which it is based, has good linearity and provides a converted analog output signal with small distortion. However, it requires high precision current adders functioning accurately corresponding to the weights accorded the bits of the input digital data and an electronic switch operating at accurate timing. Hence, there is the difficulty that the circuit scale becomes large when it is attempted to increase its resolution, and, in addition, the overall circuit must be structured with high precision.

Although the conventional D-A converter has the advantage that its circuit configuration is simple, the disadvantage is that it generates even harmonic distortion which degrades the analog signal.

Such distortion is remarkable when the signal frequency is high or the pulse rate is low. For example, as shown in FIG. 2, with respect to a fundamental wave at 10 kHz, relatively large distortion appears especially in the second harmonic domain.

In order to overcome the above described difficulties, the present applicant has already proposed a "digital-to-analog converter" utilizing a PWM system, in which a differential component between a pulse-width modulated waveform corresponding to the input digital data and a "complementary" pulse-width modulated waveform corresponding to the 2s-complement data of the input digital data is output by a differential amplifier means, and the high-frequency component of the differential output waveform is eliminated to thereby obtain the analog output signal with its harmonic distortion reduced (U.S. patent application Ser. No. 479,163, filed Feb. 13, 1990, now U.S. Pat. No. 5,021,788).

The proposed digital-to-analog converter, however, requires two PWM circuits because it generates a pair of PWM signals complementary to each other and, hence, its structure becomes rather complex.

SUMMARY OF THE INVENTION

In view of the foregoing shortcomings and disadvantages the present invention is directed to the provision of a digital-to-analog converter which is simple in structure and capable of reducing harmonic distortion, thereby providing a high quality analog signal.

According to the present invention, there is provided a digital-to-analog converter comprising a pulse-width modulated signal generation means for generating a pulse-width moudulated signal with a pulse width corresponding to input digital data and a low-pass filter means for eliminating high-frequency components of the pulse-width modulated signal to thereby output an analog signal, in which a sampling period Ts of the input digital data is divided into an even number 2 m of sampling periods, and the pulse-width modulated signal generation means generates pulse-width modulated signals with equal pulse widths n·Tu corresponding to the input digital data such that each signal is generated in each of the divided sampling period Ts/2m. Thus, it is made possible by the present invention to reduce harmonic distortion and obtain a high quality analog signal with a simple structure.

DESCRIPTION OF THE PREFERRED EMBODIMENTS

A first embodiment of a digital-to-analog converter according to the present invention will be described below with reference to FIGS. 3 through 5.

Figure 1:
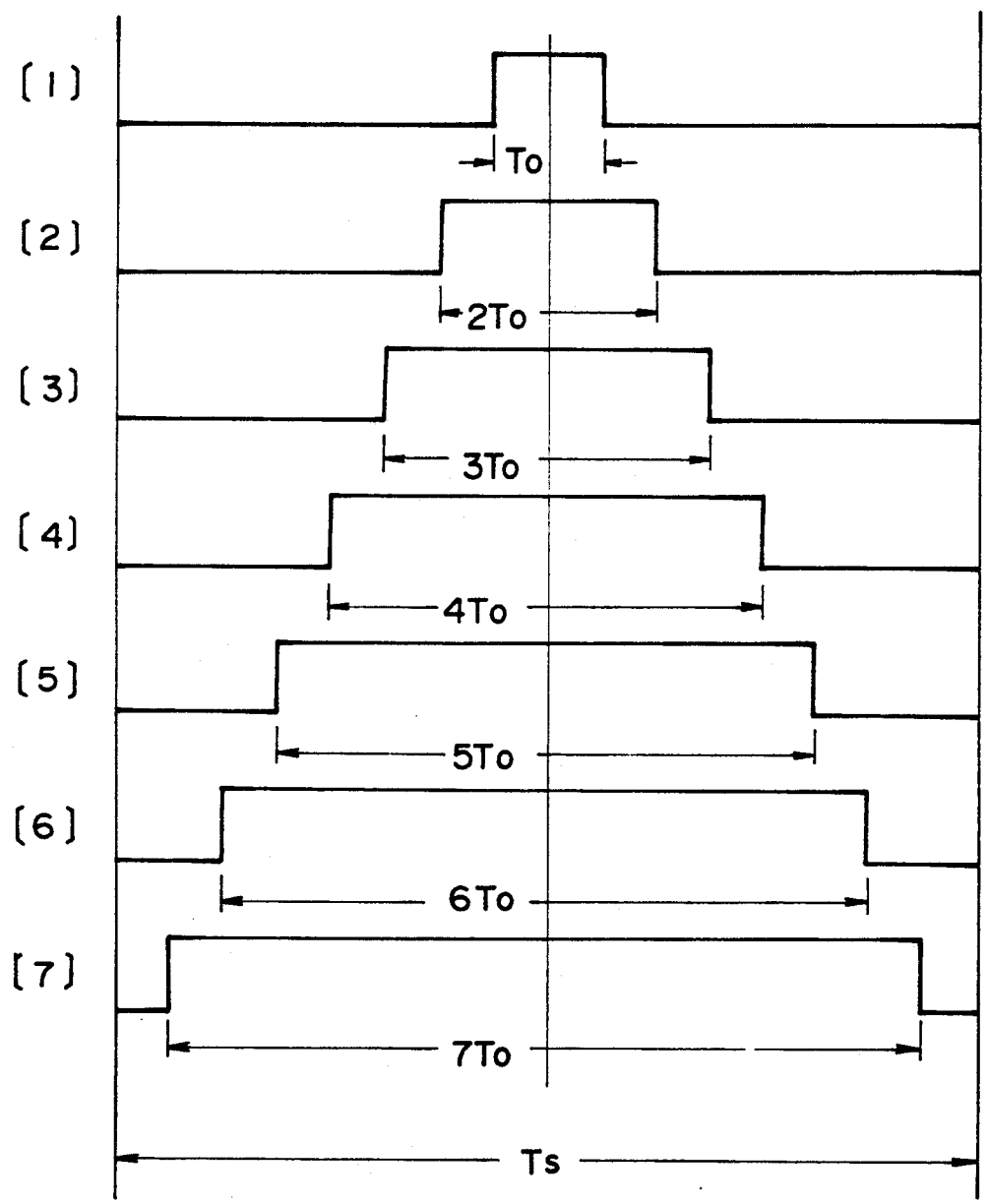
FIG. 1 is a waveform chart for explaining the operation of a prior art digital-to-analog converter.
Figure 2:
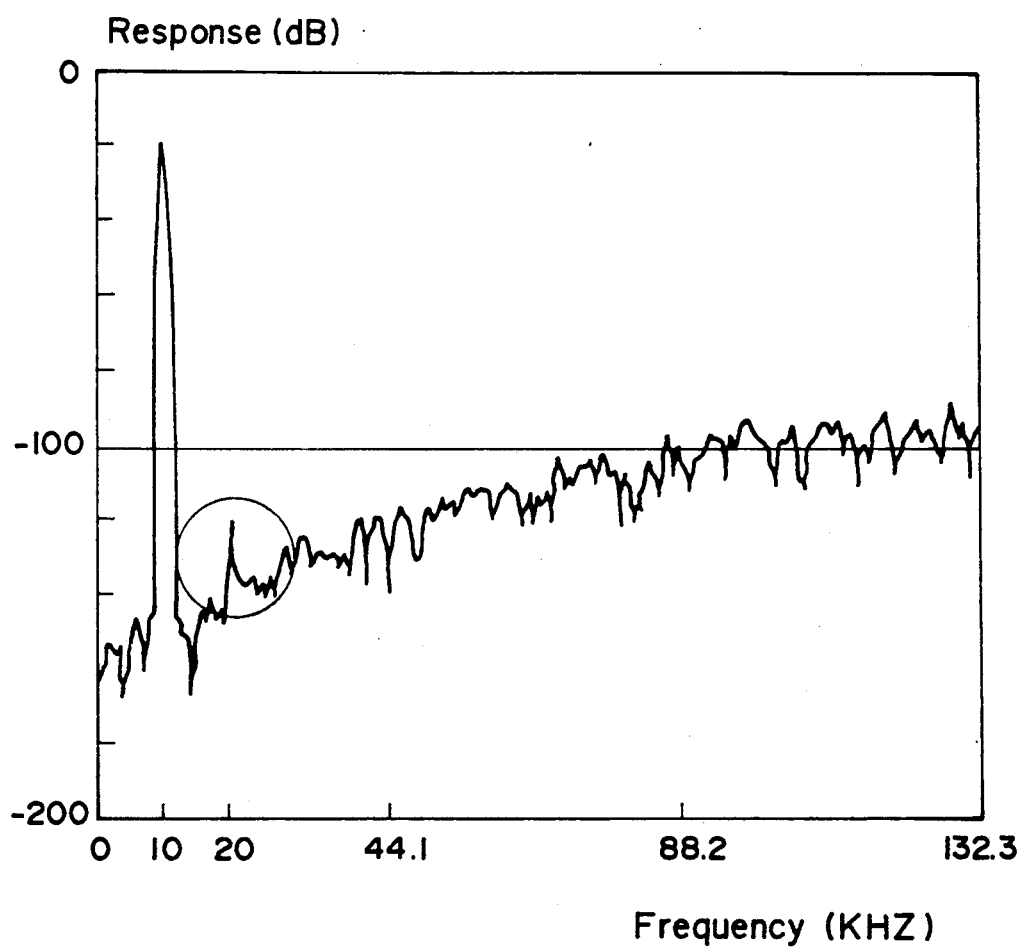
FIG. 2 is a diagram showing a spectial characteristic of a prior art example.
Figure 3:
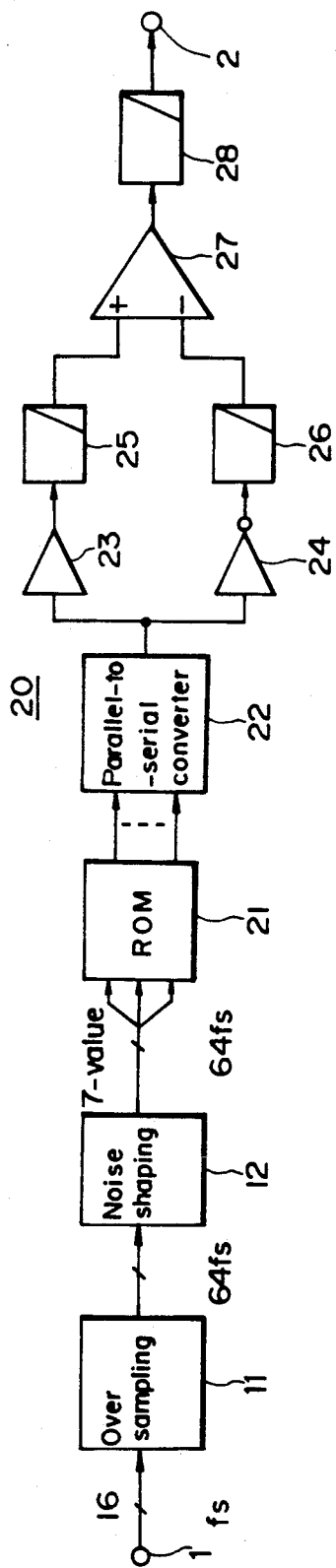
FIG. 3 is a block diagram of a first embodiment of a digital-to-analog converter according to the present invention.

FIG. 3 shows the structure of the first embodiment of the present invention.

Referring to FIG. 3, reference numeral 11 denotes an over sampling circuit, which receives, through an input terminal 1, 16-bit reproduced digital audio data having a sampling frequency fs of 44.1 kHz, and performs an over sampling process for converting the received data to digital data whose sampling frequency is 64·fs.

Reference numeral 12 denotes a noise shaping circuit, which performs a noise shaping process for rounding the 16-bit digital data output from the over sampling circuit 11 into, for example, 3-bit 7-value digital data thereby reducing the quantization noise.

Reference numeral 20 denotes a pulse-width modulation (PWM) circuit, which is formed, in the present embodiment, of a read-only memory (ROM) 21 and a parallel-to-serial converter 22. The output data from the noise shaping circuit 12 is supplied as a read address to the ROM 21 and parallel data read out of the ROM 21 are converted into serial data in the parallel-to-serial converter 22.

The serial data is commonly supplied to a buffer 23 and an inverter 24 and the outputs of the buffer 23 and the inverter 24 are respectively supplied to the noninverting input terminal and the inverting input terminal of a differential amplifier 27 through low-pass filters 25 and 26 for suitably limiting the slew rate. The output level of the differential amplifier 27 is two times greater than that of one of the input signals and is free of common mode noise. This output is supplied to an output terminal 2 through a low-pass filter 28.

Now, operation of the first embodiment of the present invention will be described below with reference also to FIG. 4.

In this embodiment, parallel data as shown in the following Table 1 are written in the ROM 21 in advance.

TABLE 1

| Address | Parallel Data | | | | | | | | | | | | | | | |
|---|---|---|---|---|---|---|---|---|---|---|---|---|---|---|---|---|
| 1 | 0 | 0 | 0 | 0 | 1 | 0 | 0 | 0 | 0 | 0 | 0 | 0 | 1 | 0 | 0 | 0 |
| 2 | 0 | 0 | 0 | 1 | 1 | 0 | 0 | 0 | 0 | 0 | 0 | 0 | 1 | 1 | 0 | 0 |
| 3 | 0 | 0 | 0 | 1 | 1 | 1 | 0 | 0 | 0 | 0 | 0 | 1 | 1 | 1 | 0 | 0 |
| 4 | 0 | 0 | 1 | 1 | 1 | 1 | 0 | 0 | 0 | 0 | 0 | 1 | 1 | 1 | 1 | 0 |
| 5 | 0 | 0 | 1 | 1 | 1 | 1 | 1 | 0 | 0 | 0 | 1 | 1 | 1 | 1 | 1 | 0 |
| 6 | 0 | 1 | 1 | 1 | 1 | 1 | 1 | 0 | 0 | 0 | 1 | 1 | 1 | 1 | 1 | 1 |
| 7 | 0 | 1 | 1 | 1 | 1 | 1 | 1 | 1 | 0 | 1 | 1 | 1 | 1 | 1 | 1 | 1 |

An address in the ROM 21 is selected according to the input data supplied from the noise shaping circuit 12, and thus, a set of parallel data is read out from the ROM 21 according to the value of the input data. The parallel data read from the ROM 21 is converted into a set of series data in the parallel-to-serial converter 22 and thereby a PWM signal as shown in FIG. 4 is generated.

Figure 4:
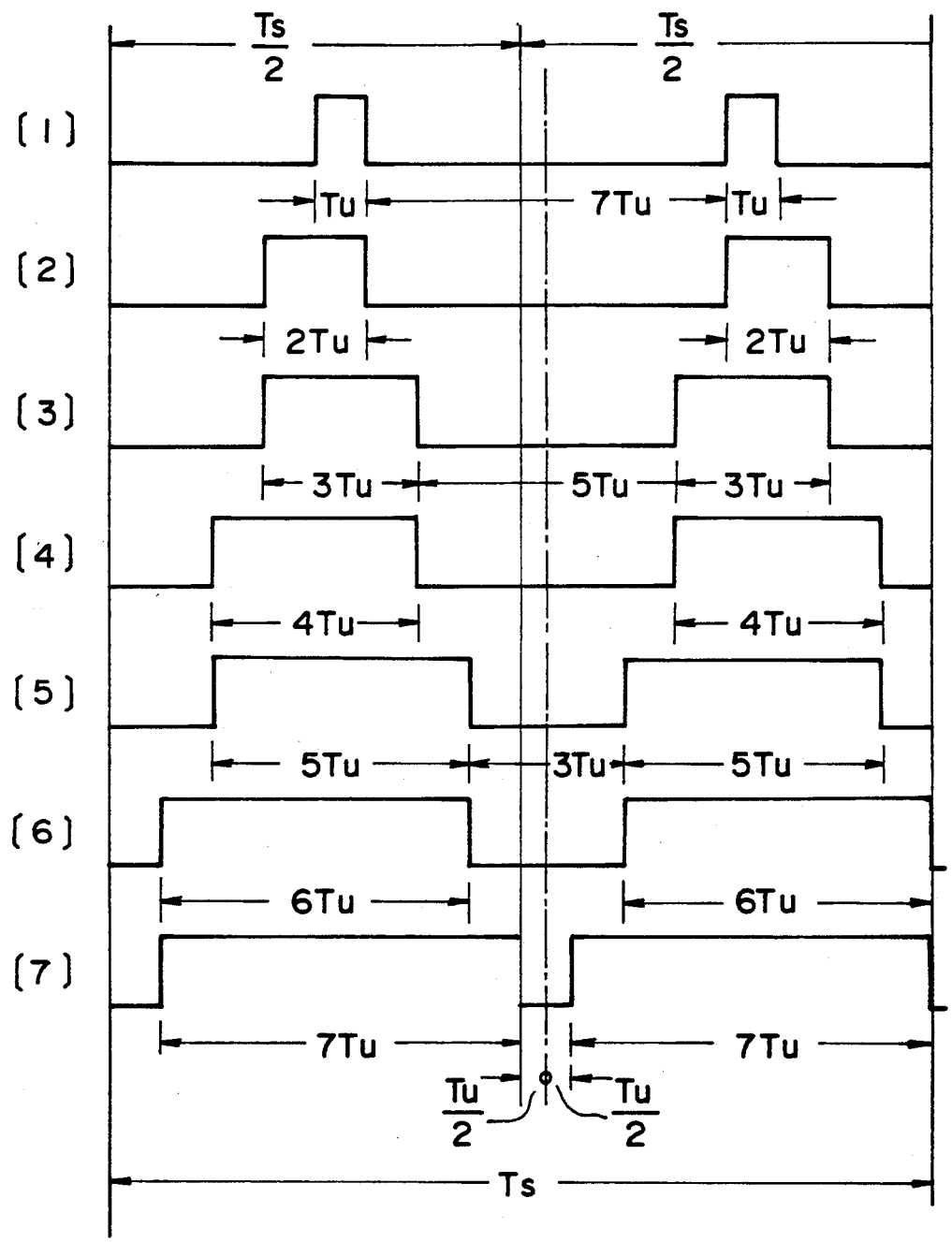
FIG. 4 is a waveform chart for explaining the operation of the first embodiment of the invention.
Figure 5:
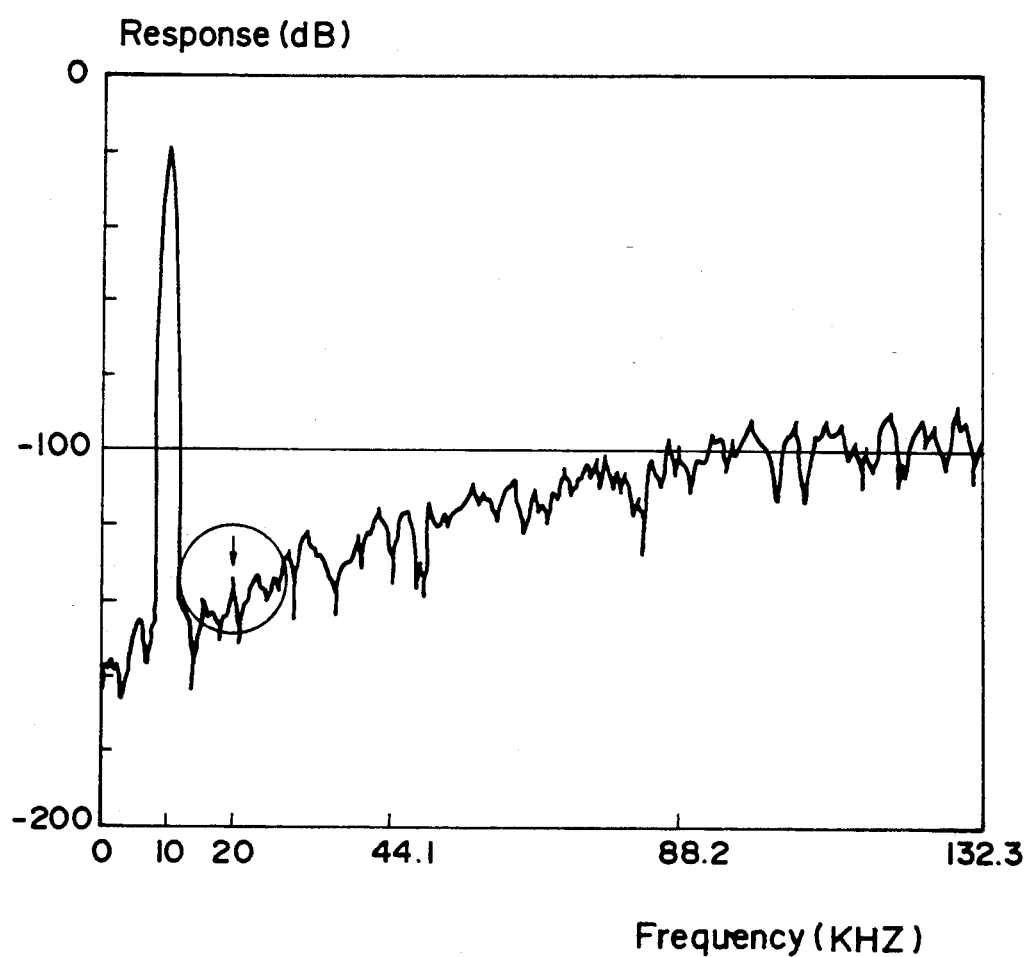
FIG. 5 is a diagram showing a spectial characteristic of the first embodiment of the invention.

As understood from FIG. 4, each of the odd-numbered PWM signals has the same PWM signal waveforms with a pulse width n. Tu (Tu being the unit pulse width) corresponding to the input data value, repeated in the first half and the second half of the sampling period Ts. As to the even-numbered signals, although each signal has the same PWM signal waveforms with a pulse width corresponding to the input data value, that in the second half is shifted backward by the unit pulse width Tu.

Therefore, in the middle of each even numbered PWM signal, there is formed a low level portion at the same interval as the immediately preceding odd-numbered PWM signal. Thus, the waveforms of each signal are symmetrically divided about the center of the low level portion, which center is delayed from the center of the sampling period Ts by Tu/2.

Further, in the first half and the second half of each of the PWM signals, the information of the input data is preserved in the form of equal pulse widths. Therefore, even if the clock frequency is fixed, the pulse rate becomes substantially higher and, accordingly, the second harmonic distortion can be greatly reduced as shown in FIG. 5 and a high quality analog signal can be obtained.

Even if the right and left waveforms of FIG. 4 are exchanged, the same effects as above can be obtained.

According to the embodiment as described above, the pulse rate can be substantially increased by the use of a simple structure. Therefore, it can be advantageously applied in an IC when the clock frequency is close to the operational upper limit.

Although, in the above embodiment, the case where the waveform of the PWM signal is divided into two waveforms was described, the waveform can be divided by another even number by repeatedly reading out the PWM signals illustrated in FIG. 4 a plurality of times (M), while the time base is compressed as the reciprocal of the number of times that the signals are read out.

Now, referring to FIG. 6, another embodiment of a digital-to-analog converter according to the present invention is described below.

Figure 6:
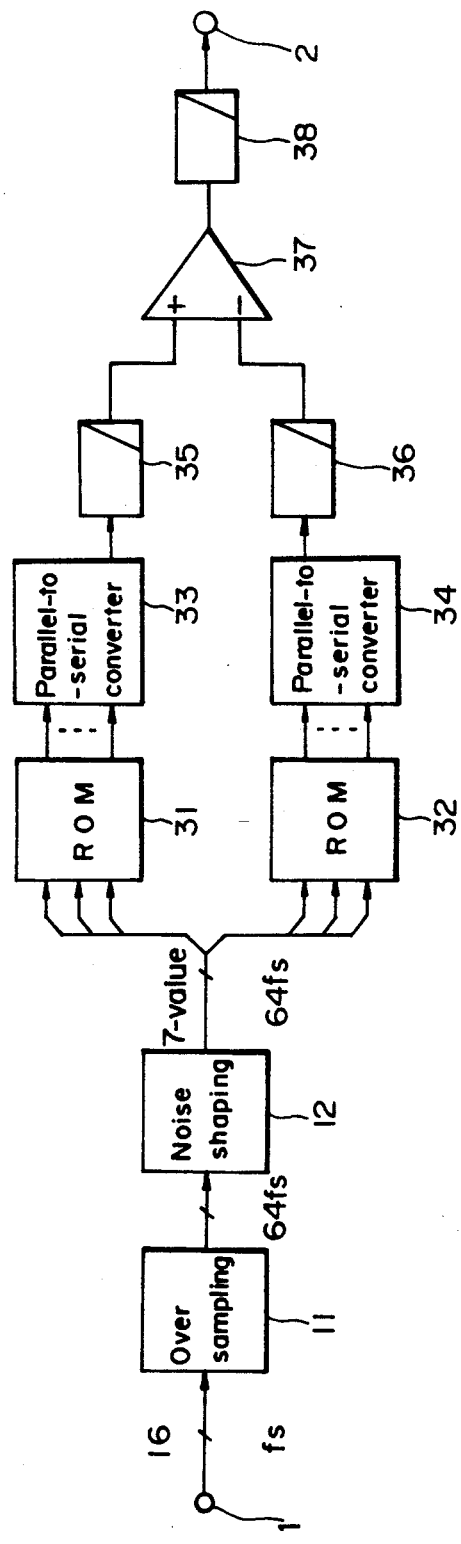
FIG. 6 is a block diagram showing another embodiment of the present invention.

FIG. 6 shows the structure of another embodiment of the invention. The parts in FIG. 6 corresponding to those in FIG. 3 are denoted by like reference numerals and repeated explanation of the same is omitted.

Referring to FIG. 6, reference numeral 30 denotes two PWM circuits, each of which in the present embodiment is formed of a ROM 31, 32 and a parallel-to-serial converter 33, 34. One ROM 31 stores the parallel data as shown in Table 1 written therein in advance and the other ROM 32 stores inverted parallel data obtained by exchanging the "1" and "0" values in Table 1 with each other written therein in advance. The outputs of the parallel-to-serial converters 33 and 34 are respectively supplied to the noninverting input terminal and the inverting input terminal of a differential amplifier 37 through low-pass filters 35 and 36, and the output of the differential amplifier 37 is supplied to an output terminal 2 through a low-pass filter 38. Otherwise, the structure is the same as that of FIG. 3.

The embodiment of FIG. 6 operates the same as the above described embodiment and provides the same effects and, further, has the advantage that it can be easily adapted to various changes in specifications and the like.

According to the present invention, since it is adapted, as described above in detail, such that the sampling period of the input digital data is divided in an even number and PWM signals of the same pulse width corresponding to the input digital data are each generated in each divided sampling period, a digital-to-analog converter utilizing a PWM system capable of providing a high quality analog signal with reduced harmonic distortion can be provided having a simple structure.

What is claimed is:

1. A digital-to-analog converter for converting input digital data having a predetermined sampling period into an analog signal, comprising:

pulse-width modulated signal generation means for generating a pulse-width modulated signal having a pulse width corresponding to said input digital data; and low-pass filter means for eliminating high-frequency components of said pulse-width modulated signal to thereby output said analog signal; wherein said pulse-width modulated signal generation means is operative to divide the sampling period of said input digital data into an integral even number of divided sampling periods and to generate a pulse-width modulated signal in each divided sampling period, said sampling period including at least two pulses having equal pulse widths symmetrically arranged about a point a predetermined interval from the center of said sampling period and corresponding to said input digital data.

2. A digital-to-analog converter according to claim 1, wherein said pulse-width modulated signal generation means comprises:

ROM means coupled to receive the input digital data as address data for outputting parallel data representing the at least two pulses of said pulse-width modulated signal in a respective one of said sampling periods; and parallel-to-serial converter means for converting said parallel data to a serial data signal corresponding to the at least two pulses of said pulse-width modulated signal.

3. A digital-to-analog converter according to claim 2, wherein said pulse-width modulated signal generation means further comprises:

buffer means and inverter means arranged in parallel and having inputs commonly coupled with the parallel-to-serial converter means for providing said serial data signal and an inverted version of said serial data signal, respectively, at corresponding outputs thereof; and differential amplifier means for providing said pulse-width modulated signal at an output thereof by producing said pulse-width modulated signal as a difference between said serial data signal and said inverted version of said serial data signal;

the output of said differential amplifier means being coupled to said low-pass filter means to supply said pulse-width modulated signal thereto.

4. A digital-to-analog converter according to claim 1, wherein said pulse-width modulated signal generation means comprises:

first ROM means coupled to receive said input digital data as address data for outputting first parallel data representing said pulse-width modulated signal;

second ROM means coupled to receive said input digital data as address data for outputting second parallel data representing an inverted version of said first parallel data;

first parallel-to-serial converter means for converting said first parallel data to serial data supplied at an output thereof and representing said pulse-width modulated signal;

second parallel-to-serial converter means for converting said second parallel data to serial data supplied at an output thereof and representing an inverted version thereof; and differential amplifier means having a noninverting input and an inverting input coupled with respective ones of the output of said first parallel-to-serial converter means and the output of said second parallel-to-serial converter means for providing said pulse-width modulated signal at an output thereof, wherein the output of said differential amplifier means is coupled with said low-pass filter means to supply said pulse-width modulated signal thereto.

* * * * *